(12) United States Patent
Sekine et al.

(10) Patent No.: US 9,130,146 B2
(45) Date of Patent: Sep. 8, 2015

(54) ACTUATOR AND OPTICAL SCANNING APPARATUS

(71) Applicants: Hisamichi Sekine, Tokyo (JP); Hisanori Aga, Tokyo (JP); Yuki Maruyama, Tokyo (JP)

(72) Inventors: Hisamichi Sekine, Tokyo (JP); Hisanori Aga, Tokyo (JP); Yuki Maruyama, Tokyo (JP)

(73) Assignee: MITSUMI ELECTRIC CO., LTD., Tokyo (JP)

(*) Notice: Subject to any disclaimer, the term of this patent is extended or adjusted under 35 U.S.C. 154(b) by 348 days.

(21) Appl. No.: 13/625,063

(22) Filed: Sep. 24, 2012

(65) Prior Publication Data
US 2013/0083382 A1    Apr. 4, 2013

(30) Foreign Application Priority Data

Sep. 30, 2011    (JP) ................................. 2011-217124

(51) Int. Cl.
*G02B 26/08*    (2006.01)
*H01L 41/047*    (2006.01)
*H01L 41/08*    (2006.01)

(52) U.S. Cl.
CPC ........ *H01L 41/0475* (2013.01); *G02B 26/0858* (2013.01); *H01L 41/0805* (2013.01)

(58) Field of Classification Search
CPC ............ H01L 41/0475; H01L 41/0805; G02B 26/0858
USPC .......... 359/198.1, 199.1, 199.4, 221.2, 224.1, 359/224.2; 310/365, 311, 321, 330–331
See application file for complete search history.

(56) References Cited

U.S. PATENT DOCUMENTS

| | | | |
|---|---|---|---|
| 8,884,497 B2 * | 11/2014 | Takahashi et al. | ............ 310/348 |
| 2010/0308692 A1 | 12/2010 | Kobayashi et al. | |
| 2012/0007477 A1 | 1/2012 | Takahashi et al. | |

FOREIGN PATENT DOCUMENTS

| | | |
|---|---|---|
| JP | 2004-006452 | 1/2004 |
| JP | 2010-259213 | 11/2010 |
| JP | 2011-018896 | 1/2011 |
| JP | 2011-061881 | 3/2011 |

OTHER PUBLICATIONS

Japanese Office Action mailed Apr. 28, 2015.

* cited by examiner

*Primary Examiner* — James Phan
(74) *Attorney, Agent, or Firm* — IPUSA, PLLC

(57) ABSTRACT

An actuator includes a drive beam; a lower electrode formed on the drive beam; a piezoelectric element provided on the lower electrode; an upper electrode provided on the piezoelectric element; an upper wiring connecting the upper electrode and a wiring for supplying a voltage to the upper electrode; and an insulating part providing electrical insulation between the upper electrode and the lower electrode and formed under the upper wiring such that it covers an end of the lower electrode. The insulating part includes insulating extension parts extended on opposite sides of the upper wiring in a width direction of the upper wiring.

5 Claims, 6 Drawing Sheets

ACTUATOR AND OPTICAL SCANNING APPARATUS

CROSS-REFERENCE TO RELATED APPLICATIONS

The present application is based upon and claims the benefit of priority of the prior Japanese Application No. 2011-217124, filed on Sep. 30, 2011, the entire contents of which are incorporated hereby by reference.

FIELD

The present invention is related an actuator which includes a drive beam, a lower electrode formed on the drive beam, a piezoelectric element provided on the lower electrode and an upper electrode provided on the piezoelectric element, and an optical scanning apparatus.

BACKGROUND

Japanese Laid-open Patent Publication No. 2010-259213 discloses an optical scanning apparatus in which a mirror part for reflecting incident light is rotated about a rotation axis by an actuator, which includes an upper electrode on an upper surface of a piezoelectric body and a lower electrode on a lower surface of the piezoelectric body, such that a scanning operation is performed with the reflected light. This actuator includes an upper wiring connecting to the upper electrode and a lower wiring connecting to the lower electrode in order to apply the voltage to the piezoelectric body.

FIG. 1 is a diagram for explaining the upper wiring of the actuator according to prior art. The actuator 10 illustrated in FIG. 1 has a multi-layered configuration such that the piezoelectric body is formed between the lower electrode 11 and the upper electrode 12. The lower electrode 11 is connected to a common lower wiring (not illustrated). The upper electrode 12 is connected to an upper wiring 13. According to the actuator 10, the piezoelectric body is driven by applying the voltage between the common lower wiring and the upper wiring 13.

Further, according to the prior art actuator 10 illustrated in FIG. 1, when the lower electrode 11 and the upper electrode 12 are layered, an end portion (outer edge) 11T of the lower electrode 11 under the upper electrode 12 extends off the upper electrode 12. Therefore, in the actuator 10, an insulating part 14 is formed such that it covers the end portion 11T of the lower electrode 11 where the upper wiring 13 is formed in order to prevent contact between the lower electrode 11 and the upper electrode 12.

According to the prior art technique, if the difference t3 between the width t1 of the insulating part 14 and the width t2 of the upper wiring is not sufficient, there may be risk that the insulating part 14 is broken when such a great voltage which generates potential difference between the lower electrode 11 and the upper electrode 12 is applied.

SUMMARY

According to an embodiment, an actuator is provided which includes a drive beam; a lower electrode formed on the drive beam; a piezoelectric element provided on the lower electrode; an upper electrode provided on the piezoelectric element; an upper wiring connecting the upper electrode and a wiring for supplying a voltage to the upper electrode; and an insulating part providing electrical insulation between the upper electrode and the lower electrode and formed under the upper wiring such that it covers an end of the lower electrode, wherein the insulating part includes insulating extension parts extended on opposite sides of the upper wiring in a width direction of the upper wiring.

DESCRIPTION OF EMBODIMENTS

Figure 1:
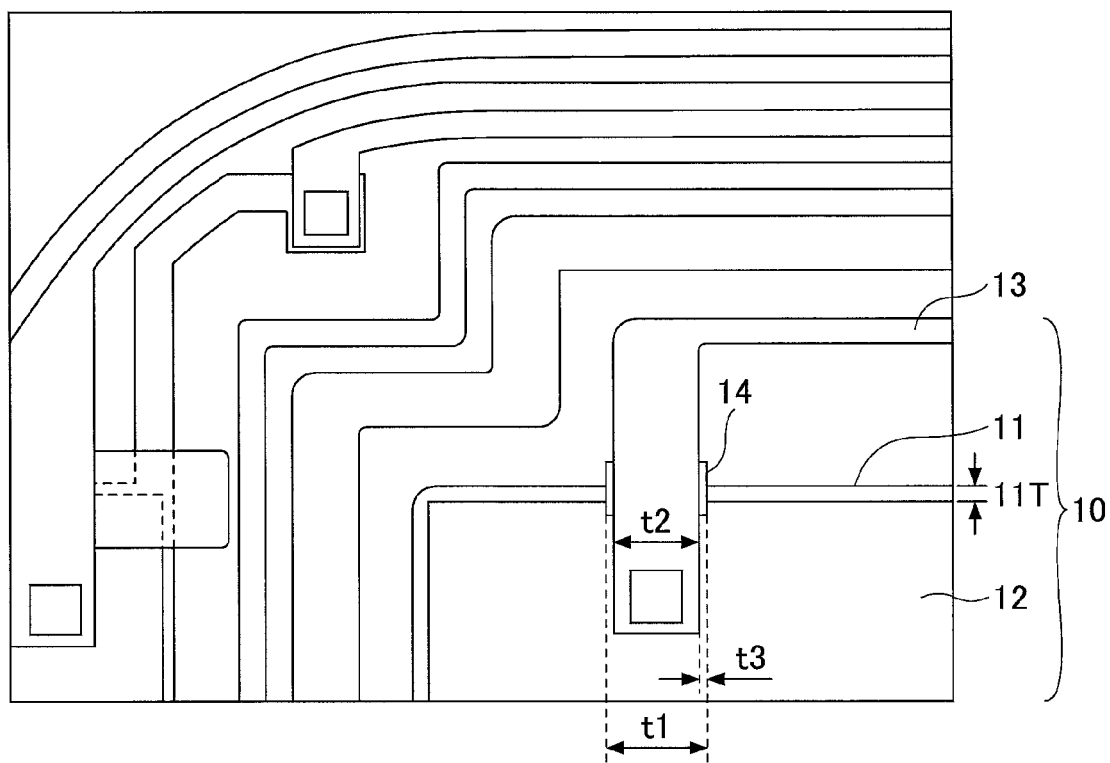
FIG. 1 is a diagram for explaining the upper wiring of the actuator according to prior art.
Figure 2:
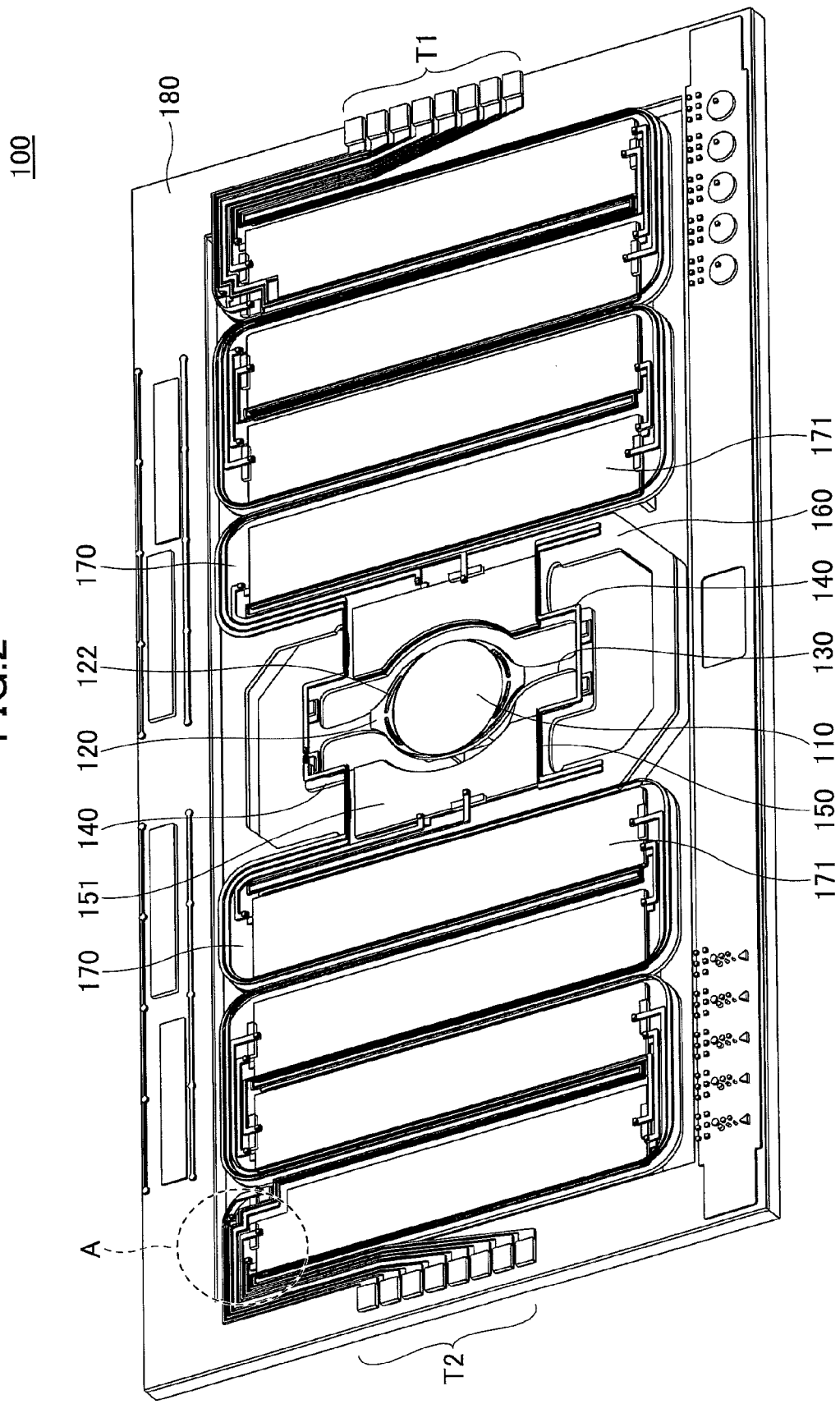
FIG. 2 is a diagram for explaining an optical scanning apparatus according to an embodiment.

In the following, embodiments of the present invention will be described with reference to the accompanying drawings. FIG. 2 is a diagram for explaining an optical scanning apparatus according to an embodiment, and FIG. 3 is another diagram for explaining an optical scanning apparatus according to an embodiment.

Figure 3:
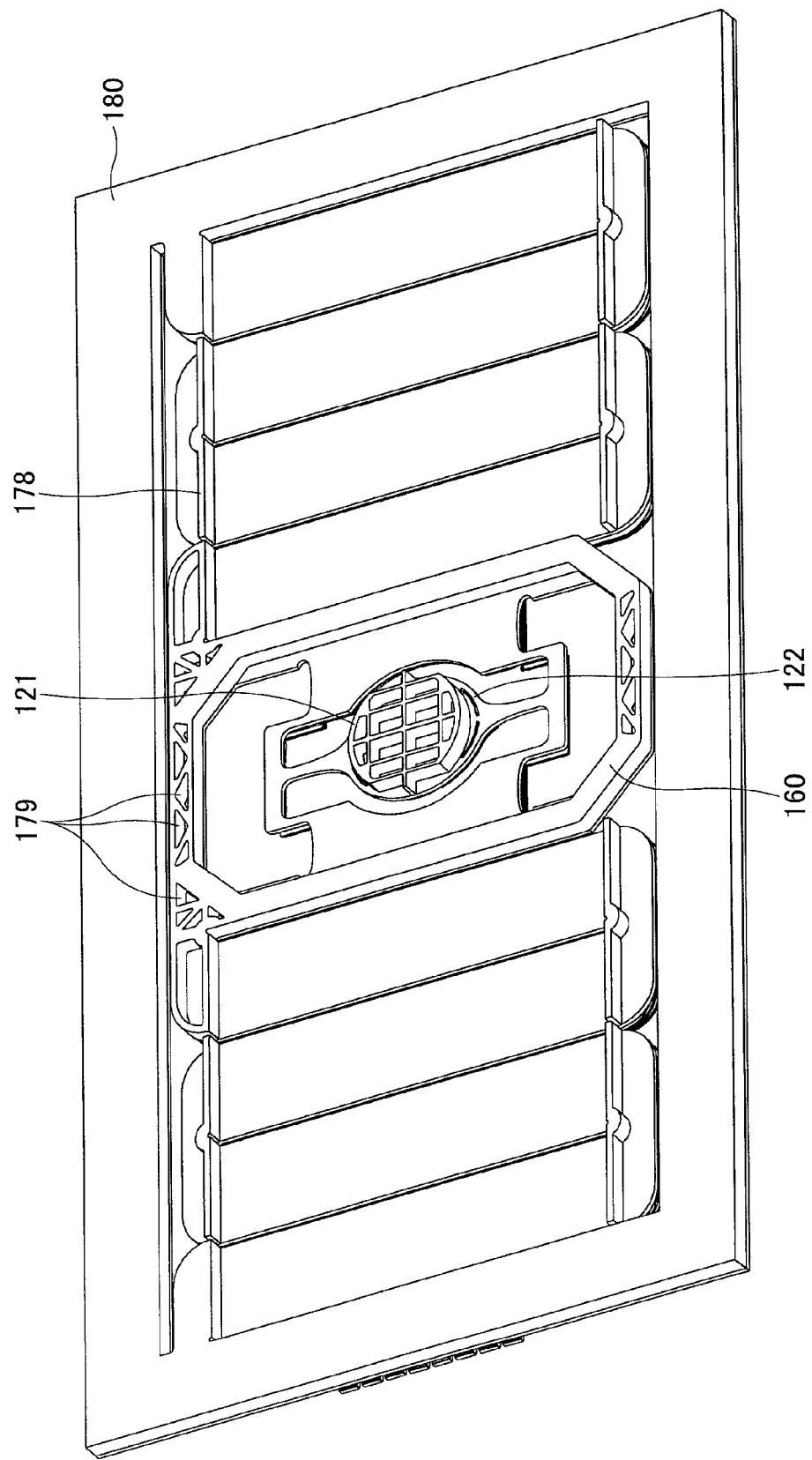
FIG. 3 is another diagram for explaining an optical scanning apparatus according to an embodiment.

In FIG. 2 and FIG. 3, the optical scanning apparatus 100 includes a mirror 110, a mirror supporting part 120, torsion beams 130, a connection beam 140, first drive beams 150, a movable frame 160, second drive beams 170 and a fixed frame 180. Further, as illustrated in FIG. 2, the first drive beams 150 include drive sources 151 and the second drive beams 170 includes drive sources 171.

Further, the optical scanning apparatus 100 includes ribs 121 provided on the back of the mirror supporting part 120, and ribs 17B for preventing the superposition of the harmonic components which are provided on the backs of the second drive beams 170, as illustrated in FIG. 3.

The mirror supporting part 120 according to the embodiment has slits 122 formed along the circumference of the mirror 110. With the slits 122, the torsion of the torsion beams 130 can be transmitted to the mirror 110 while reducing the weight of the mirror supporting part 120. Further, the second drive beams 170 according to the embodiment have concave portions 179 on the backs thereof. The concave portions 179 may have a shape of a triangle pole as illustrated in FIG. 3. It is preferred that the concave portions 179 are formed on the back of the movable frame 160. Forming the concave portions 179 in the movable frame 160 contributes weight reduction of the movable frame 160 while keeping the strength of the movable frame 160.

In FIG. 2 and FIG. 3, the mirror 110 is formed on the surface of the mirror supporting part 120, and the mirror supporting part 120 is connected to the ends of the torsion beams 130 which are provided on the opposite sides of the mirror supporting part 120. The torsion beams 130 define a swing axis and extend in the axis direction to support the mirror supporting part 120 from the opposite sides in the axis direction. When the torsion beams 130 are twisted, the mirror 110 supported on the mirror supporting part 120 is moved to swing such that the scanning operation with the reflected light of the light illuminated to the mirror 110 is performed. The torsion beams 130 are connected to and supported by the connection beam 140 and are connected to the first drive beams 150.

The first drive beams 150, the connection beam 140, the torsion beams 130, the mirror supporting part 120 and the mirror 110 are surrounded by the movable frame 160. The first drive beams 150 are supported by the movable frame 160 at one side, and extend inwardly to be connected to the connection beam 140. The first drive beams 150 are provided as a pair such that the mirror 110 and the mirror supporting part 120 are arranged between the first drive beams 150 in a direction perpendicular to the torsion beams 130.

Each drive source 151 is formed on the surface of the corresponding first drive beam 150. The drive source 151 includes an upper electrode and a lower electrode. The upper electrode is formed on the upper face of the thin film of the piezoelectric element provided on the surface of the first drive beams 150 which functions as a diaphragm. The lower electrode is formed on the lower face of the piezoelectric element. The drive source 151 extends and contracts according to the polarity of the voltage applied between the upper electrode and the lower electrode. Thus, when voltages with different phases are applied to the first drive beam 150 on the left side and the first drive beam 150 on the right side, the first drive beams 150 are oscillated such the first drive beam 150 on the left side of the mirror 110 and the first drive beam 150 on the right side of the mirror 110 are moved to the upper side alternately, which causes the mirror 110 to be moved to swing around the axis defined by the torsion beams 130.

The direction of the swing of the mirror 110 around the axis defined by the torsion beams 130 is referred to as a horizontal direction, hereinafter. For example, the horizontal drive by the first drive beams 150 may be implemented by the resonant vibration and the mirror 110 may be driven to swing at a high speed. Further, each second drive beam 170 has one end connected to the outer side of the movable frame 160. The second drive beam 170 includes beam elements in a zigzag pattern as a whole such that the beam elements, which extend in parallel with the first drive beams 150, have the ends connected to the adjacent beam elements.

The other end of the second drive beam 170 is connected to the inside of the fixed frame 180. Similarly, the second drive beams 170 are provided as a pair such that the movable frame 160 is arranged between the second drive beams 170 in the left and right direction. The surface of the second drive beam 170 has thin films of the piezoelectric elements which are formed as the drive sources 171 on a rectangular section basis not including the curved portions.

By applying the voltages with different phases to the adjacent drive sources 171 on a rectangular section basis, the adjacent rectangular beams are deformed to the upper direction alternately, and thus the accumulation of the movements of the respective beams in the upper direction can be transmitted to the movable frame 160. Thus, the mirror 110 can be moved to swing in the direction perpendicular to the horizontal direction, that is to say, in the vertical direction. For example, the driving forces of the second drive beams 170 may be generated by non-resonant vibration.

In the following, the drive source 151 and the drive source 171 are described. The drive source 151 according to, the embodiment includes an upper electrode and a lower electrode, and the drive source 171 according to the embodiment includes an upper electrode and a lower electrode. The upper electrode and the lower electrode of the drive source 151 are connected to an upper wiring and a lower wiring, respectively, which are extended from terminal groups T1 and T2 provided on the fixed frame 180.

According to the embodiment, the electrical breakdown is prevented even if such a voltage, which may produce great potential difference between the lower electrode and the upper electrode, is applied to generate the driving force of the second drive beams 170 by the non-resonant vibration.

Figure 4:
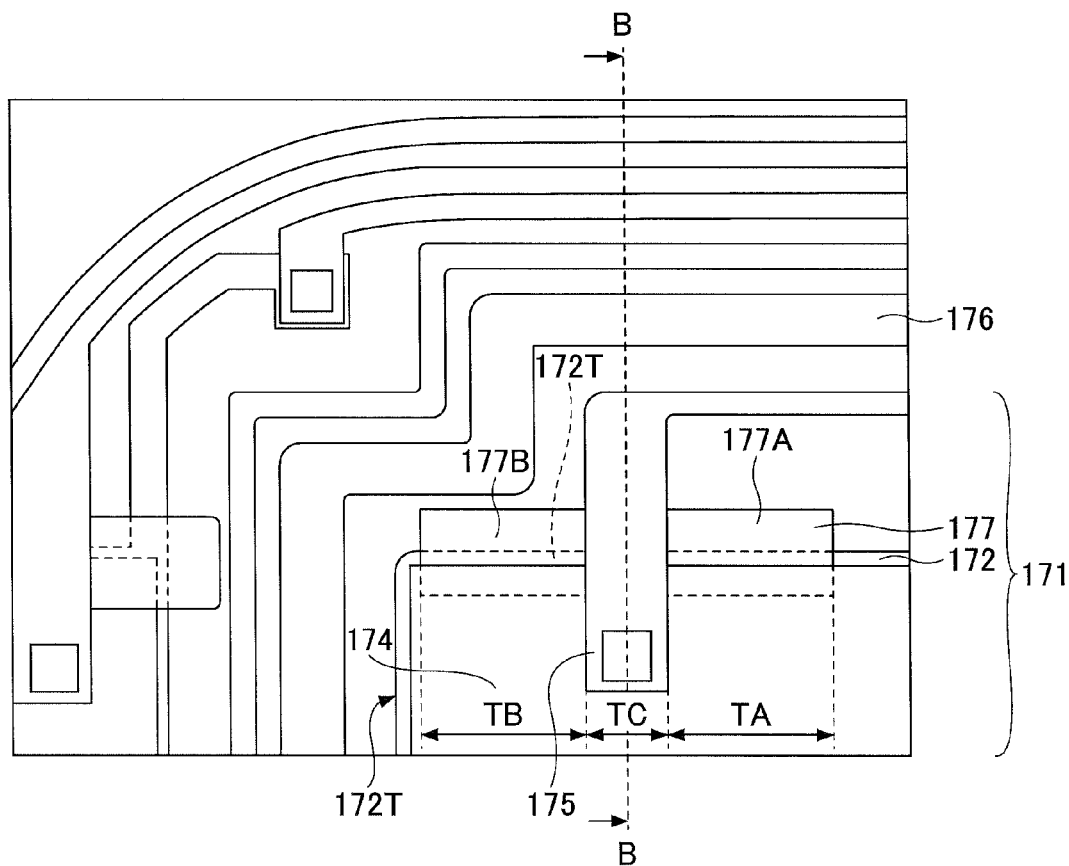
FIG. 4 is an enlarged diagram of a part A in FIG. 2.
Figure 5:
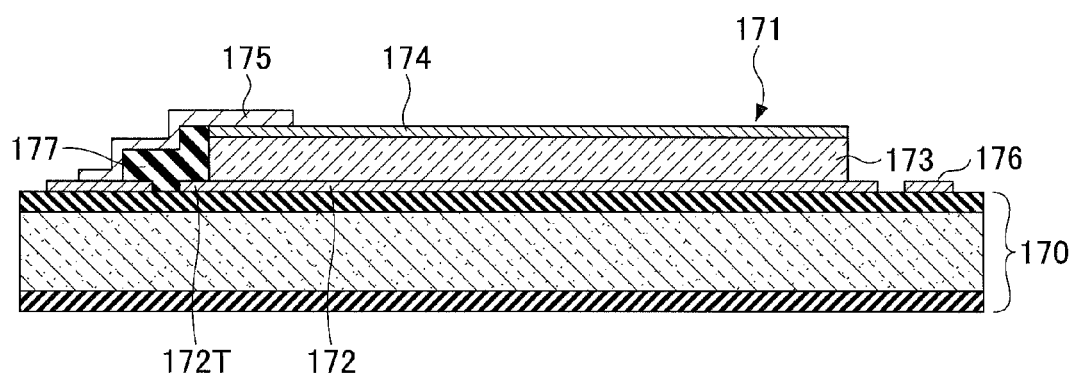
FIG. 5 is a cross-section diagram along a line B-B in FIG. 4.

In the following, the upper electrode and the lower electrode are described. FIG. 4 is an enlarged diagram of a part A in FIG. 2, and FIG. 5 is a cross-section diagram along a line B-B in FIG. 4. In FIG. 4 and FIG. 5, the drive source 171 is described as an example.

The drive source 171 is configured such that a lower electrode 172, a piezoelectric element 173 and an upper electrode 174 are layered on the second drive beam 170 which becomes a diaphragm. The upper electrode 174 is connected to a wiring, which is extended from the external drive voltage supply of the optical scanning apparatus 100, via an upper wiring 175. The lower electrode 172 is connected to the external drive voltage supply of the optical scanning apparatus 100 via a lower common wiring 176.

Further, according to the embodiment, an insulating part 177 is formed to prevent an electrical connection between the lower electrode 172 and the upper electrode 174.

The insulating part 177 according to the embodiment includes insulating extension parts 177A and 177B which extends in a direction away from the upper wiring 175. The extension parts 177A and 177B are formed on the opposite sides of the upper wiring 175 such that they don't come into contact with the wirings formed on the second drive beam 170. When it is assumed that the widths of the insulating extension parts 177A and 177B according to the embodiment are TA and TB, respectively, and the width of the upper wiring 175 is TC, it is preferred that the widths TA and TB are greater than or equal to three times of the width TC.

According to the embodiment, since the insulating part 177 is configured to include the insulating extension parts 177A and 177B, the electrical breakdown can be prevented even if such a great voltage, which may produce the potential difference between the upper electrode 174 and the lower electrode 172, is applied.

According to the embodiment, even if an end portion (outer edge) 172T of the lower electrode 172 extends off the upper electrode 174, it is possible to ensure reliability of the electrical connection between the upper electrode 174 and the lower electrode 172 while enabling the application of great voltage to the drive source 171.

Thus, according to the embodiment, it is also possible to generate the driving force of second drive beam 170 with the non-resonant vibration which requires applying a great voltage which may produce the potential difference between the upper electrode 174 and the lower electrode 172. It is noted that, according to the embodiment, the great voltage may be within a range from 80 V to 150 V. Further, the widths TA and TB may be less than three times of the width TC. In the embodiment, for example, the widths TA and TB may be in a range from about 10 micron to about 150 micron.

Further, in the embodiment, the widths TA and TB are the same; however, this relationship is not indispensable. For example, the width TA is greater than the width TB, and vice versa.

In the embodiment, the same configuration may be provided not only for the part A of the drive source 171 but also all the locations where the upper electrode 174 and the lower electrode 172 are connected. Further, in the embodiment, only the drive source 171 is explained; however, the drive source 151 is the same. Specifically, insulating parts which include insulating extension parts are provided at the locations where the upper electrodes and the lower electrodes of the drive sources 151 are connected.

Next, an insulating film of the insulating part 177 according to the embodiment is explained. The insulating film of the insulating part 177 according to the embodiment may be configured by layering an inorganic insulating film and an organic insulating film which have different dielectric constants.

Figure 6:
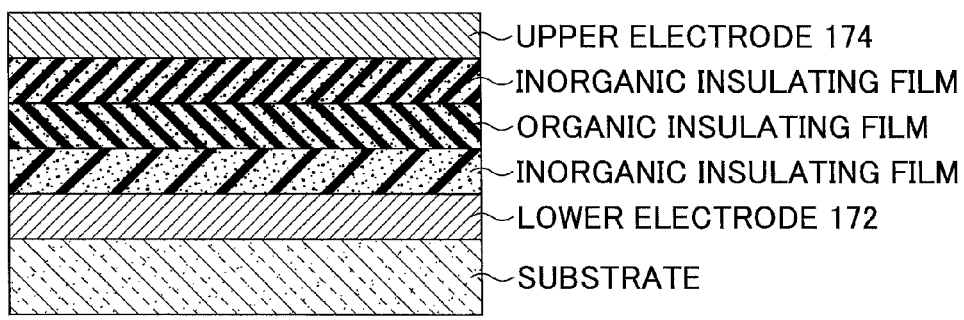
FIG. 6 is a diagram for illustrating a configuration of an insulating film.

FIG. 6 is a diagram for illustrating a configuration of an insulating film. In the following, a way of forming the insulating film is described.

The inorganic insulating film is formed by applying an ALD (Atomic Layer Deposition) method, a CVD (Chemical Vapor Deposition) method, a sputtering method, etc., on a wafer on which the lower electrode 172 is formed. The inorganic insulating film used is a metallic oxide or a metallic nitride.

After having formed the inorganic insulating film, the organic insulating film is formed by a spin coating method or a dip method. The organic insulating film used is BCB-based, novolac-based, acrylic based, polyimide based, polyamide based, etc. After having formed the organic insulating film, the inorganic insulating film formed on the organic insulating film again.

In an example, an $Al_2O_3$ film was formed with a thickness of 50 nm by the ALD method on the wafer on which the lower electrode 172, for example, was formed. The dielectric constant of the $Al_2O_3$ film is from 9.0 to 10. Further, in the example, a BOB resin film (CYCLOTENE commercially available from Dow Chemical Company) was with a thickness of 2 μm by the spin coating method on the $Al_2O_3$ film. The dielectric constant of the BCB resin film is from 2.5 to 3.0. Then, a further $Al_2O_3$ film is formed with a thickness of 50 nm on the BCB resin film.

Figure 7:
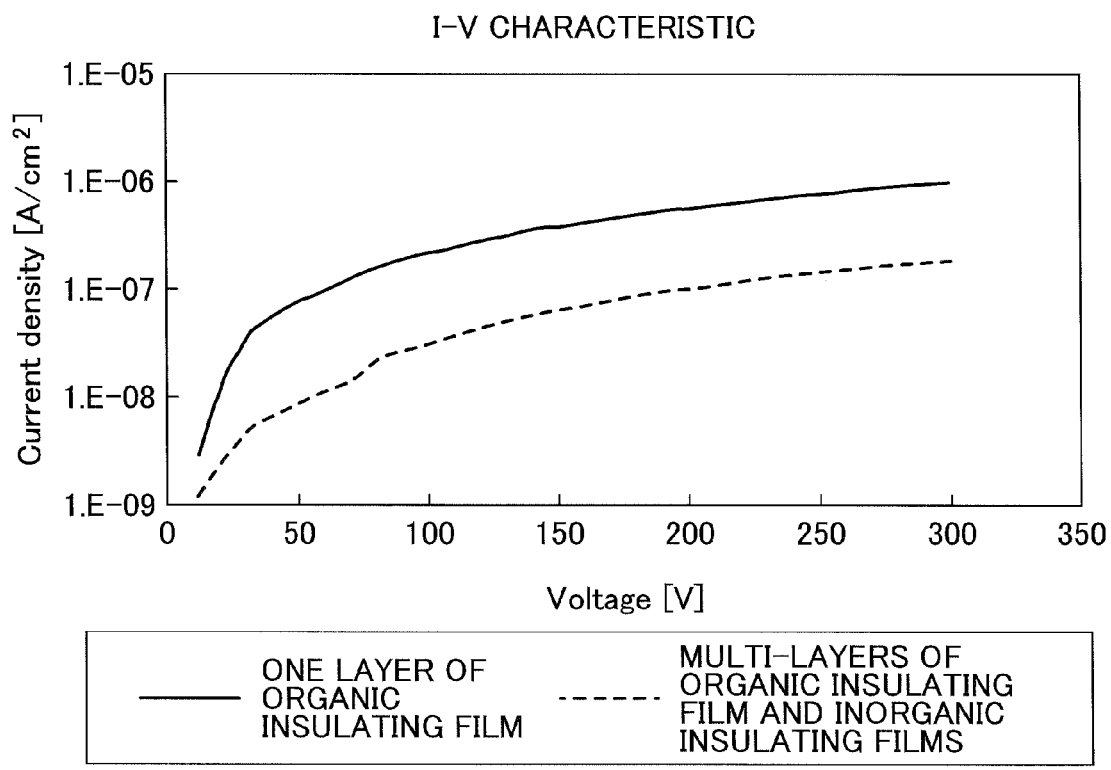
FIG. 7 is a diagram for illustrating a leakage current characteristic of the insulating film.

FIG. 7 is a diagram for illustrating a leakage current characteristic of the insulating film. As is clear from FIG. 7, the insulating film in which the organic insulating film and the inorganic insulating films are layered has the increased withstanding pressure with respect to the insulating film which includes only one layer of the organic insulating film.

Thus, the insulating part 177 according to the embodiment has the increased insulation withstanding pressure so that the electrical breakdown can be reduced. Further, the insulating part 177 according to the embodiment has the improved resistance to chemical attack and resistance to humidity with respect to the insulating film which includes only one layer of the organic insulating film.

Figure 8:
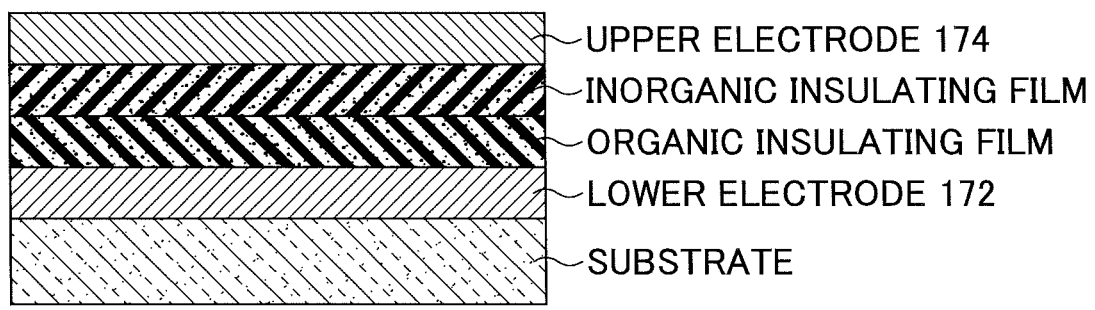
FIG. 8 is another diagram for illustrating a configuration of an insulating film.

It is noted that in the example, the insulating film is configured to have three layers of the inorganic insulating film, the organic insulating film and the inorganic insulating film; however, this is not indispensable. For example, two layered configuration may be possible, as illustrated in FIG. 8. FIG. 8 is another diagram for illustrating a configuration of the insulating film.

In the example illustrated in FIG. 8, an organic insulating film is formed on a wafer on which the lower electrode 172 is formed, and an inorganic insulating film is formed on the organic insulating film. Then, the upper electrode 174 is formed on the inorganic insulating film.

The present invention is disclosed with reference to the preferred embodiments. However, it should be understood that the present invention is not limited to the above-described embodiments, and variations and modifications may be made without departing from the scope of the present invention.

What is claimed is:

1. An actuator, comprising:
   a drive beam;
   a lower electrode formed on the drive beam;
   a piezoelectric element provided on the lower electrode;
   an upper electrode provided on the piezoelectric element;
   an upper wiring connecting the upper electrode and a wiring for supplying a voltage to the upper electrode; and
   an insulating part providing electrical insulation between the upper electrode and the lower electrode and formed under the upper wiring such that it covers an end of the lower electrode, wherein
   the insulating part includes insulating extension parts extended on opposite sides of the upper wiring in a width direction of the upper wiring, and
   the insulating part includes an inorganic insulating film and an organic insulating film.

2. The actuator of claim 1, wherein the inorganic insulating film is sandwiched between organic insulating films.

3. The actuator as claimed in claim 1, wherein the width of the insulating extension parts is in a range from about 10 micron to about 150 micron.

4. An actuator, comprising:
   a drive beam;
   a lower electrode formed on the drive beam;
   a piezoelectric element provided on the lower electrode;
   an upper electrode provided on the piezoelectric element;
   an upper wiring connecting the upper electrode and a wiring for supplying a voltage to the upper electrode; and
   an insulating part providing electrical insulation between the upper electrode and the lower electrode and formed under the upper wiring such that it covers an end of the lower electrode, wherein
   the insulating part includes insulating extension parts extended on opposite sides of the upper wiring in a width direction of the upper wiring,
   wherein the width of the insulating extension parts is greater than or equal to three times of the width of the upper wiring.

5. An optical scanning apparatus, comprising:
   an actuator including a drive beam, a lower electrode formed on the drive beam, a piezoelectric element provided on the lower electrode and an upper electrode provided on the piezoelectric element; and
   a mirror part which is moved to swing by the actuator to reflect incident light such that a scanning operation is performed with the reflected light, wherein
   the actuator further comprising:
   an upper wiring connecting the upper electrode and a wiring for supplying a voltage to the upper electrode; and
   an insulating part providing electrical insulation between the upper electrode and the lower electrode and formed under the upper wiring such that it covers an end of the lower electrode, wherein
   the insulating part includes insulating extension parts extended on opposite sides of the upper wiring in a width direction of the upper wiring, and
   the insulating part includes an inorganic insulating film and an organic insulating film.

* * * * *